United States Statutory Invention Registration [19]

[11] Reg. Number: H170

Binari [43] Published: Dec. 2, 1986

[54] SELF ALIGNED NOTCH FOR INP PLANAR TRANSFERRED ELECTRON OSCILLATOR

[75] Inventor: Steven G. Binari, Camp Springs, Md.

[73] Assignee: Goverment of the United States of America, Washington, D.C.

[21] Appl. No.: 818,512

[22] Filed: Jan. 13, 1986

[51] Int. Cl.[4] ..... H01L 21/00; H01L 21/308; H01L 21/467; H01L 21/94

[52] U.S. Cl. ..... 29/576 B; 29/578; 29/590; 156/659.1; 427/91; 427/250

[56] References Cited

PUBLICATIONS

"Notched InP Planar Transferred Electron Oscillators," S. C. Binari et al., International Electron Devices Meeting, Dec. 1982.

"Self-Aligned Notched Planar InP Transferred-Electron Oscillators," S. C. Binari et al., IEEE Electron Device Letters, EDL-6, No. 1, Jan. 1985.

*Primary Examiner*—John F. Terapane
*Assistant Examiner*—Eric Jorgensen
*Attorney, Agent, or Firm*—Robert F. Beers; Sol Sheinbein; Stephen G. Mican

[57] ABSTRACT

A method of fabricating a notched indium phosphide planar transferred electron oscillator device which automatically aligns the high-resistivity notch position immediately adjacent to the cathode contact by slant evaporation of a metal coating over the edge of a masking layer followed by ion implantation.

10 Claims, 5 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

SELF ALIGNED NOTCH FOR INP PLANAR TRANSFERRED ELECTRON OSCILLATOR

BACKGROUND OF THE INVENTION

The present invention is directed to transferred electron oscillators (TEOs), and more particularly to methods for fabricating InP TEOs.

Indium phosphide has excellent material properties for the operation of TEO devices in the millimeter-wave region of the radio spectrum. As a result of these material properties, high efficiency oscillators and low-noise broadband amplifiers have been developed. The devices used for the oscillator and amplifier development have been fabricated on n+ substrates, and accordingly, integration within a monolithic format is not easily achieved. For further application in millimeter-wave monolithic circuits, this work has focused on the development of a planar transferredelectron device formed on a semi-insulating substrate.

Planar InP TEOs have been constructed whose design includes a localized high resistivity region near the cathode contact. The high resistivity region, referred to as a notch, partially extends into the active layer and is formed by selective boron implanatation damage. This design creates a localized high electric field region, which produces a laterally uniform well-defined space-charge nucleation site. The notched devices demonstrate significantly superior microwave performance compared to devices without a notch. At x-band, notched TEO devices operate with direct current (DC) to radio frequency (RF) conversion efficiencies of up to 4.5 percent, while the TEO devices without a notch operate with an efficiency of less than 1 percent.

However for highest efficiency, the region of selective ion implantation must be aligned between the TEO device cathode and anode contacts, as close as possible to the cathode contact. As the device dimensions are decreased to meet the need of higher frequency operation, a different method of fabrication must be employed to accurately position the notch next to the cathode contact.

OBJECTS OF THE INVENTION

Accordingly, one object of the invention is to fabricate a high-efficiency planar InP TEO device.

Another object of the invention is to fabricate a high-efficiency planar InP TEO device for operation at extremely high frequencies.

Yet another object of the invention is to fabricate a high-efficiency planar InP TEO which includes an aligned high resistivity notch region in the device substrate between the device cathode and anode contacts.

Still another object of the invention is to fabricate a high efficiency planar InP TEO device which includes the high resistivity notch region in the device substrate aligned immediately adjacent to the cathode contact.

A further object of the invention is to fabricate a high efficiency planar InP TEO device which includes automatically aligning the high resistivity notch region in the device substate adjacent to the cathode contact.

SUMMARY OF THE INVENTION

These and other objects of the invention are achieved by a method of fabrication which includes applying a masking layer with voids in it to define cathode and anode region metallization patterns, slant evaporating a metallic film onto the masking layer to form an uncoated region adjacent to the cathode region, and ion implanting the uncoated area to form a high resistivity notch region in the substrate immediately adjacent to the cathode region. Removal of the masking layer with its metallic film coating followed by alloying then forms a planar InP TEO device structure with an automatically aligned high resistivity notch region.

Other objects, features and advantages of the invention will be apparent to those skilled in the art in the description of the preferred embodiment of the invention as described below and also recited in the appended claims.

DESCRIPTION OF THE PREFERRED EMBODIMENT

Figure 1:
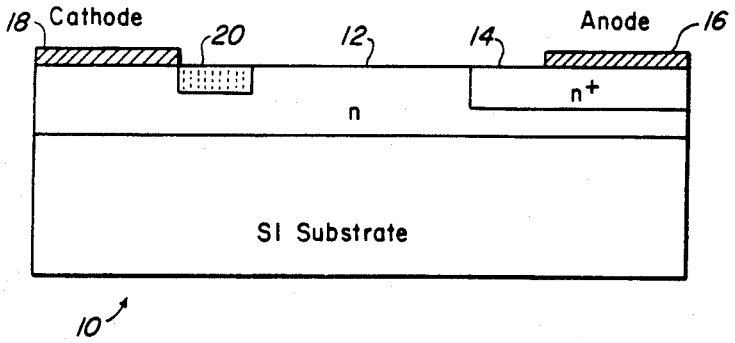
FIG. 1 shows a self-aligned notch InP TEO device as produced by the fabrication process according to the invention.

Referring to the drawings, wherein like reference characters designate like or corresponding parts throughout the views, FIG. 1 shows a cross-sectional side view of the desired device structure for the self-aligned InP TEO. An indium phosphide substrate 10 has an n-doped epitaxial surface layer 12. The surface layer 12 includes an n+-doped anode region 14 which partially penetrates the surface layer 12. The anode region 14 has an ohmic anode contact 16 on its surface. An area of said surface layer 12 has an ohmic cathode contact 18 on its surface. Between the cathode contact 18 and the anode contact 16, a high-resistivity impurity-containing notch region 20 partially penetrates the surface layer 12 immediately adjacent to the cathode contact 18.

Figure 2:
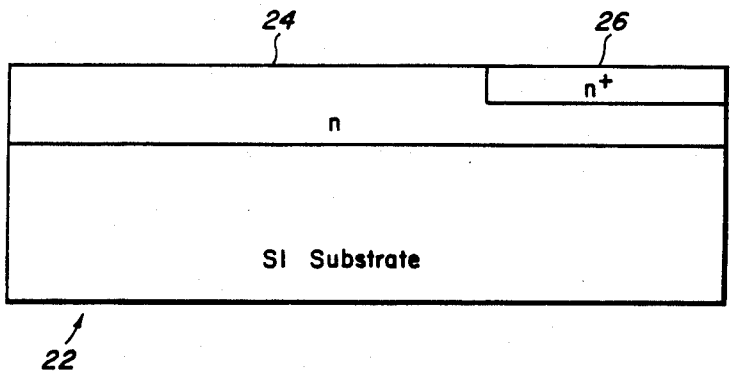
FIG. 2 shows the doped semiconductor substrate selected for the fabrication process according to the invention.

The fabrication process of the invention is illustrated in FIGS. 2 through 5. As shown in FIG. 2, a semi-insulating InP substate 22 is selected having an epitaxially grown n-type InP surface layer 24 with at least one n+-doped anode region 26 imbedded in the surface layer 24. By way of example, a suitable substrate 22 may have an epitaxial surface layer 24 in the range of 0.8 to 1.5 μm in thickness, but preferably in the range of 0.9 μm in thickness, with a carrier concentration in the range of 1 to $10\times10^{16}\,cm^{-3}$, but preferably in the range of $6\times10^{16}\,cm^{-3}$, and the n+-doped anode region 26 may be formed in the surface layer 24 by selective ion implantation, as will be recognized by those skilled in the art.

Figure 3:
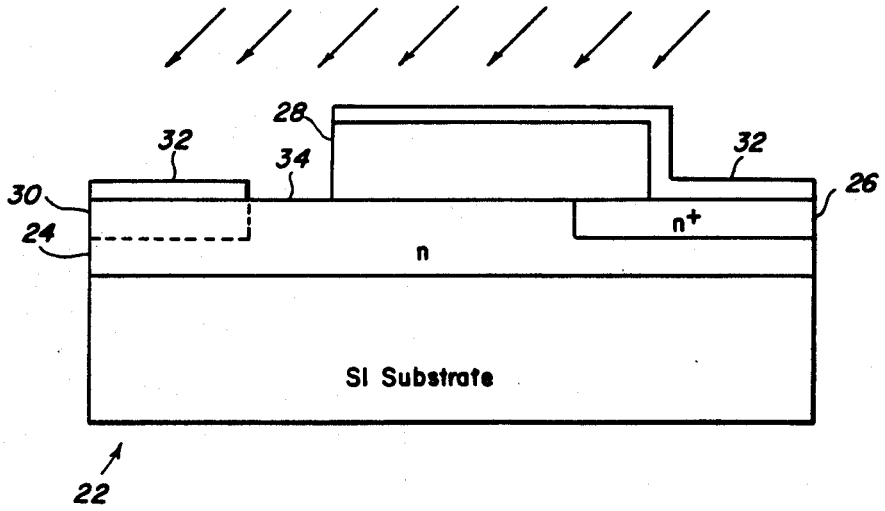
FIG. 3 shows the slant evaporation phase of the fabrication process according to the invention.

As shown in FIG. 3, a masking layer 28, which may be, by way of example, a photoresist mask in the range of 1 μm in thickness, is applied over the surface of the surface layer 24. The masking layer 28 includes two voids through it, one void over the anode region 26, and the other void closely spaced to the anode region to define a cathode region 30. A metallization layer 32 is then evaporated onto the masking layer 28 at an angle from perpendicular to the masking layer 28, having a slant in a direction from the anode region 26 toward the cathode region 30. By way of example, the metallization layer 32 may comprise a laminate of gold over gold germanium layers each in the range of 1000 Å in thickness, evaporated onto the masking layer 28 at an angle in the range of 10 to 45 degrees, but preferably in the range of 22 degrees. By evaporating the metallization layer 32 at an angle, the metallization layer 32 acquires a narrow void region 34 between the cathode region 30 and masking layer 28 due to the shadow effect of the edge of the masking layer 28.

Figure 4:
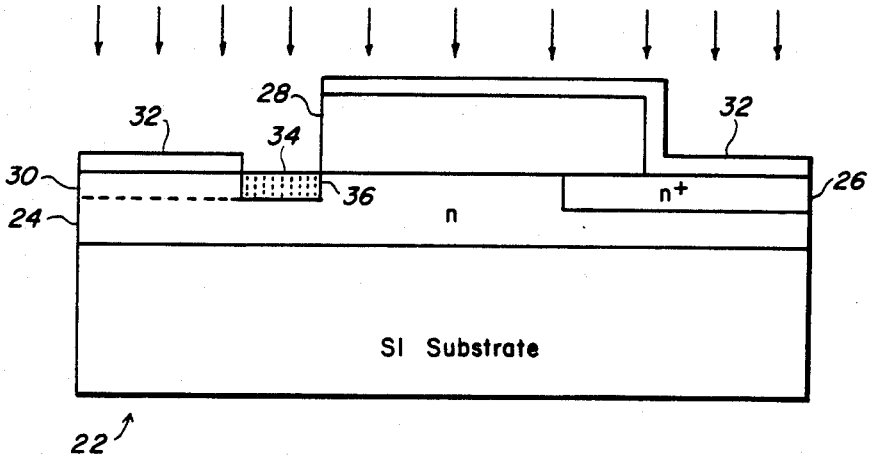
FIG. 4 shows the oxygen implanatation phase of the fabrication process according to the invention.

As shown in FIG. 4, the surface of the metallization layer 32 is then subjected to ion implantation. Ions only penetrate into the substrate surface layer 24 through the metallic layer void region 34, creating a high resistivity notch region 36 penetrating the surface layer 24. By way of example, oxygen atoms may be implanted to create the high resistivity notch region 36.

Figure 5:
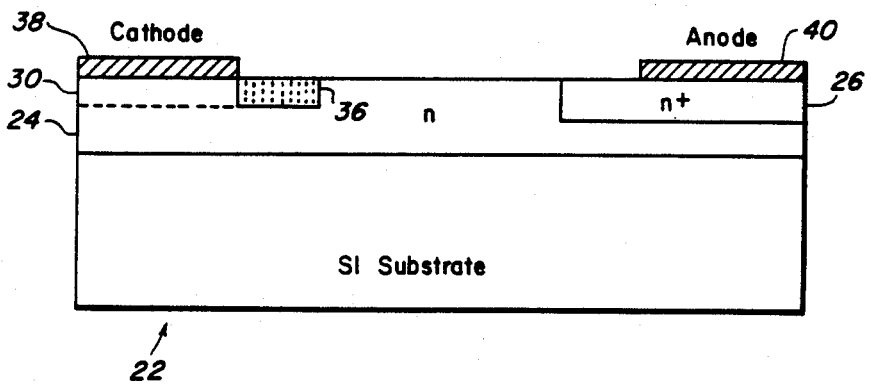
FIG. 5 shows the completed self-aligned TEO structure after the alloying phase of the fabrication process according to the invention.

As shown in FIG. 5, the masking layer 28 is then chemically removed, and the portion of the metallization layer in contact with it is stripped off. The substrate is then alloyed to change the remaining portion of the metallization layer 32 covering the cathode region 30 into an ohmic cathode contact 38, and the portion covering the anode region 26 to an ohmic contact 40. By way of example, alloying at a temperature of about 400° C. for a period of 30 seconds is sufficient, as will be apparent to those skilled in the art.

It will be understood that various changes in the details, materials and arrangement of steps and components which have been herein described and illustrated in order to explain the nature of the invention may be made by those skilled in the art.

What is claimed and desired to be secured by Letters Patent of the United States is:

1. A method of fabricating an indium phosphide transferred-electron oscillator device comprising the steps of:

selecting a semi-insulating indium phosphide substrate with an epitaxial n-type surface layer and an $n^+$-doped anode region in said surface layer;

applying a masking layer over said surface layer including a first void over said anode region and a second void over an adjacent cathode region;

evaporating a metallization layer at an angle from perpendicular to said masking layer, having a slant in a direction from said anode region to said cathode region, to create a narrow void in said metallization layer adjacent to said cathode region due to shadow effect of said masking layer;

implanting impurity ions into said surface layer through said metallization layer void to create a narrow high-resistivity region adjacent to said cathode region;

removing said masking layer with the portion of said metallization layer which contacts it, to create a cathode region metallization layer over said cathode region and an anode region metallization layer over said anode region; and alloying said substrate to convert said cathode metallization layer to an ohmic cathode contact and said anode metallization layer to an anode ohmic contact.

2. The method of fabricating an indium phosphide transfered-electron oscillator device as recited in claim 1, wherein the step of slant evaporating a metallization layer further comprises evaporating said metallization layer at said slant angle in the range of 10 to 45 degrees from perpendicular to said masking layer.

3. The method of fabricating an indium phosphide transferred-electron oscillator device as recited in claim 2, wherein the step of applying a masking layer over said surface layer further comprises applying said masking layer with a thickness in the range of 1 μm.

4. The method of fabricating an indium phosphide transferred-electron oscillator device as recited in claim 3, wherein the step of selecting a semi-insulating indium phosphide substrate further comprises selecting said substrate having said epitaxial n-type surface layer with a thickness in the range of 0.8 to 1.5 μm.

5. The method of fabricating an indium phosphide transferred-electron oscillator device as recited in claim 4, wherein the step of selecting a semi-insulating indium phosphide substrate further comprises selecting said substrate having said epitaxial n-type surface layer with a carrier concentration in the range of 1 to $10\times10^{16}$ $cm^{-3}$.

6. The method of fabricating an indium phosphide transferred-electron oscillator device as recited in claim 5, wherein the step of applying a masking layer further comprises applying said masking layer selected from the group of photoresist materials.

7. The method of fabricating an indium phosphide transferred-electron oscillator device as recited in claim 6, wherein the step of slant evaporating a metallization layer further comprises slant evaporating a metallization layer of gold over gold germanium laminate layers.

8. The method of fabricating an indium phosphide transferred-electron oscillator device as recited in claim 7, wherein the step of removing said masking layer further comprises chemically removing said masking layer.

9. The method of fabricating an indium phosphide transferred-electron oscillator device as recited in claim 8, wherein the step of slant evaporating a metallization layer further comprises evaporating said gold over gold germanium laminate layer with a gold lamination thickness and a gold germanium lamination thickness each in the range of 1000 Å.

10. A method of fabricating an indium phosphide transferred-electron oscillator device comprising the steps of:

selecting a semi-insulating indium phosphide substrate with an epitaxial surface layer having a thickness in the range of 0.9 μm and a carrier concentration in the range of $6\times10^{16}$ $cm^{-3}$, and an $n^+$-doped anode region in said surface layer;

applying a masking layer over said surface layer having a thickness in the range of 1 μm including a first void over said anode region and a second void over an adjacent cathode region;

evaporating a metallization layer comprising a laminate of gold in the range of 1000 Å in thickness over gold germanium in the range of 1000 Å in thickness, at an angle from perpendicular to said masking layer in the range of 22 degrees, having a slant in a direction from said anode region to said cathode region, to create a narrow void in said metallization layer adjacent to said cathode region due to shadow effect of said masking layer;

implanting impurity ions into said surface layer through said metallization layer void to create a narrow high-resistivity region adjacent to said cathode regions;

chemically removing said masking layer with the portion of said metallization layer which contacts it, to create a cathode region metallization layer over said cathode region and an anode region metallization layer over said anode region; and alloying said substrate at a temperature in the range of 400° C. for a time period in the range of 30 seconds to convert said cathode metallization layer to an ohmic cathode contact and said anode metallization layer to an anode ohmic contact.

* * * * *